(12) United States Patent
Breitschadel

(10) Patent No.: US 8,467,547 B2
(45) Date of Patent: Jun. 18, 2013

(54) AUDIO COMPRESSOR WITH FEEDBACK

(75) Inventor: Hannes Breitschadel, Vienna (AT)

(73) Assignee: AKG Acoustics GmbH, Vienna (AT)

( * ) Notice: Subject to any disclaimer, the term of this patent is extended or adjusted under 35 U.S.C. 154(b) by 1345 days.

(21) Appl. No.: 11/940,617

(22) Filed: Nov. 15, 2007

(65) Prior Publication Data

US 2008/0212799 A1    Sep. 4, 2008

(30) Foreign Application Priority Data

Nov. 17, 2006   (EP) .................................... 06450169

(51) Int. Cl.
*H03G 7/00*   (2006.01)

(52) U.S. Cl.
USPC ............ 381/106; 381/104; 381/107; 381/108

(58) Field of Classification Search
USPC .................................. 381/106, 107, 108, 104
See application file for complete search history.

(56) References Cited

U.S. PATENT DOCUMENTS

| 5,185,806 | A |   | 2/1993 | Dolby et al. |
|---|---|---|---|---|
| 5,434,922 | A |   | 7/1995 | Miller et al. |
| 6,122,331 | A | * | 9/2000 | Dumas .......................... 375/345 |
| 6,757,396 | B1 |   | 6/2004 | Allred |
| 2002/0085725 | A1 | * | 7/2002 | Bizjak ............................ 381/106 |
| 2003/0215032 | A1 | * | 11/2003 | Langlais et al. ............... 375/345 |
| 2004/0258246 | A1 |   | 12/2004 | Tanghe |
| 2007/0270988 | A1 | * | 11/2007 | Goldstein et al. ................ 700/94 |
| 2008/0310652 | A1 | * | 12/2008 | Gustavsson ................... 381/106 |

FOREIGN PATENT DOCUMENTS

| CN | 1254454 A | 5/2000 |
|---|---|---|
| CN | 1797242 A | 7/2006 |
| WO | WO 99/00896 | 1/1999 |

\* cited by examiner

*Primary Examiner* — Kimberly Rizkallah
*Assistant Examiner* — Timor Karimy
(74) *Attorney, Agent, or Firm* — O'Shea Getz P.C.

(57) ABSTRACT

An audio compressor may regulate the level of an audio input signal depending on whether the level is above or below a threshold value. The audio compressor may control a pumping that is created when regulating a dynamic range of an audio signal with the threshold value. A feedback loop connecting the signal output from the audio compressor with a release filter may be used to modify an effective release time of the signal. A controller may be used that allows a filter coefficient of the release filter to be controlled to adjust the effective release time as a function of the signal output.

21 Claims, 7 Drawing Sheets

AUDIO COMPRESSOR WITH FEEDBACK

1. PRIORITY CLAIM

This application claims the benefit of priority from European Patent Application No. 06450169.5, filed on Nov. 17, 2006, which is incorporated by reference.

BACKGROUND OF THE INVENTION

1. Technical Field

This application relates to an audio compressor that adjusts a signal level.

2. Related Art

An audio compressor may be used to adjust the range of an audio signal. An audio signal may be compressed to maintain an audio signal level and limit the dynamic range. A compressor may alter a perceived volume. Quieter parts of a signal may be amplified and the louder parts may be attenuated. The compressor may reduce the audio gain when the amplitude of the signal exceeds a threshold.

The audio output from the audio compressor may be subject to a pumping phenomenon. The pumping may be gain pumping and may be caused by a regular amplitude peak that changes the volume for an entire audio signal. The pumping may include audible settings which may be perceived by the ear as a breathing sound or a pumping sound. Pumping may occur when the peaks of a signal fall just below the threshold value without an additional bass sound (with limited compression) and once a bass sound begins. In this state, the signal level is raised above the threshold and the entire signal is attenuated, not just the bass sound. When the bass stops, the signal may be amplified. When the threshold level is exceeded periodically, the listener may perceive a periodic attenuation of the entire signal.

SUMMARY

An audio compressor may regulate the level of an audio input signal. A detector may compare the audio input signal with a threshold. The comparison may adjust the level of the audio output from the audio compressor. The audio output may be regulated through a feedback loop that adjusts the dynamic range of the audio output.

The audio compressor may control a pumping effect that may occur when regulating a dynamic range of an audio signal with a threshold value. A feedback loop connecting the signal output from the audio compressor with a release filter may modify an effective release time of the signal. A controller may modify the effective release time through filter coefficients or other parameters of the release filter. A user may adjust the filter coefficients or other parameters to control the pumping effect.

Other systems, methods, features, and advantages will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
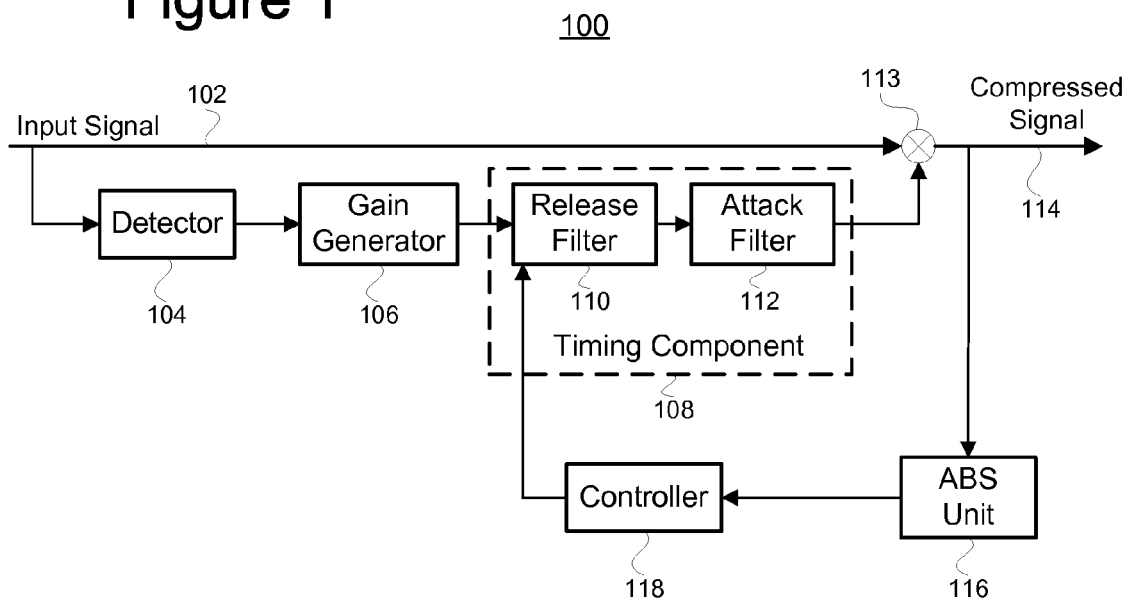
FIG. 1 is an audio compressor.

An audio compressor may produce a dynamic adaptation to a desired standard. An audio compressor may monitor the input level of a signal and adjust the input level. The compressor may limit a transmitted signal when an input level exceeds a threshold value. The compressor attenuates the input signal according to a compression ratio or other conditions. The amount of change may be a function of the input level and the difference between the input level and the threshold value. A compression ratio of about 2:1 may indicate that the dynamic range at the input corresponds to double the dynamic range at the output. An input signal whose level changes about 2 dB from the threshold may generate an output signal with a level change of about 1 dB relative to the threshold.

Audio compressors may be used in recording studios or in broadcasting facilities to adapt some aspect of an audio signal to a transmission circuit. A reduction in the dynamic range of a signal may increase the efficiency of transmission. One or more devices may function as an audio compressor. Some devices may implement a dynamic processing that is different to hear (e.g., inaudible) to reduce pumping and control effects. Some devices may utilize pumping as an audible effect. A compressor operating in an inaudible range may be used in the jazz and/or classical music fields to adapt to a transmission channel, such as a radio. An audio compressor that generates audible effects may be used for percussion in the Pop/Rock genre to produce a more impressive (louder) sound.

The pumping phenomenon or effect may occur when a compressor reacts dynamically to a statically perceived music signal, such as a calm background, by modifying the amplitude. Pumping or other control effects may be negligible when the compressor responds dynamically to a dynamic point in a piece of music, such as an accent. Compressor pumping may be disturbing or may be desirable depending on the application. Some compressors may attempt to suppress pumping, while other compressors utilize the pumping effect for artistic expression. An audio compressor system may allow for an adjustment of various parameters to either increase or minimize a pumping effect of the output from an audio compressor.

An audio compressor may include a feedback loop connecting the signal output of the audio compressor to a release filter. The feedback loop may include a controller that allows at least one filter coefficient or parameter of the release filter to be modified in response to the output signal of the audio compressor. The modification of one or more filter coefficients or parameters may modify the effective release time. The effective release time may increase the closer the compressor output level converges to a threshold. A user may adjust the filter coefficients or parameters to control the pumping effect. An adjustable parameter may be applied to the output signal level as a weighting factor and the change in the effective release time occurs depending on the ratio between the weighted signal output level and the threshold.

FIG. 1 is an audio compressor 100. The audio compressor 100 may receive an input signal 102 that is transmitted to a detector 104. A gain generator 106 may amplify the signal before a timing component 108 (e.g., a release filter 110 and an attack filter 112) selectively parses elements. A feedback loop of a compressed output signal 114 is passed through an absolute value (ABS) unit 116 and a controller 118 to the release filter 110. The audio compressor 100 receives the input signal 102 and generates the compressed signal 114 as an output. The compressed signal 114 is passed back to the release filter 110 as a feedback loop. The feedback loop may change filter coefficient(s) of the release filter 114. The filter coefficient(s) may include a user adjustable parameter that allows a user to modify the effective release time of the compressor.

The input signal 102 may be an audio signal that is generated by an acoustic source. The acoustic source may include a recording or live sound. The input signal 102 may have a dynamic range, which covers the level (amplitude or volume) over which the input signal 102 may cover. The dynamic range may be the difference between the loudest and the quietest sound that may be produced by an acoustic source. In one system, a compact disc (CD) may have a dynamic range of about 96 decibels (dB), a human voice may have a dynamic range up to about 12 dB, and an orchestra may have a dynamic range up to about 140 dB.

The detector 104 receives the input signal 102. The detector may perform a modulation function that is determined by computing a root mean square (RMS) value of the input signal 102. The RMS value may be used because it corresponds to the perceived volume. Alternatively, a measurement of the absolute value, the peak value, the rectification value, or other measurements of the input signal 102 may also be made by the detector 104. In one system, a standardized process with squaring of the samples and subsequent filtering with a recursive first order low-pass filter and a typical time constant, such as about 50 ms, may be used.

Figure 2:
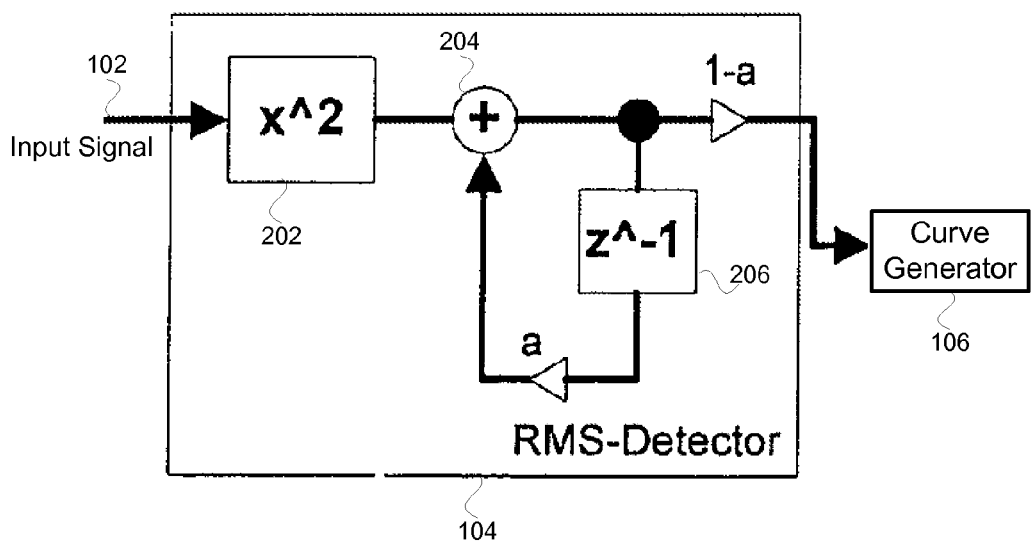
FIG. 2 is a detector that may be part of an audio compressor.

FIG. 2 is a detector 104 that may be part of the audio compressor 100. The detector computes an RMS value of the input signal 102. The value is squared by circuit 202 and added by a summer 204. A feedback loop from an inverter 206 is received by the summer 204. The detector 104 transmits a signal to the gain generator 106.

A gain generator 106 communicates with the detector 104 and the release filter 110. The gain generator 106 may comprise a curve generator and may generate a characteristic curve output. The detector 104 provides an RMS calculation to the gain generator 106. In some systems, a RMS calculation does not occur when the signal is converted to a logarithm in the gain generator 106. The square root may be calculated in the logarithmic domain by dividing by 2. In other systems, the calculations may remain in the linear domain rather than the logarithmic domain. The output of the gain generator 106 may include the modulation function, which may be transmitted through the timing component 108.

Figure 3:
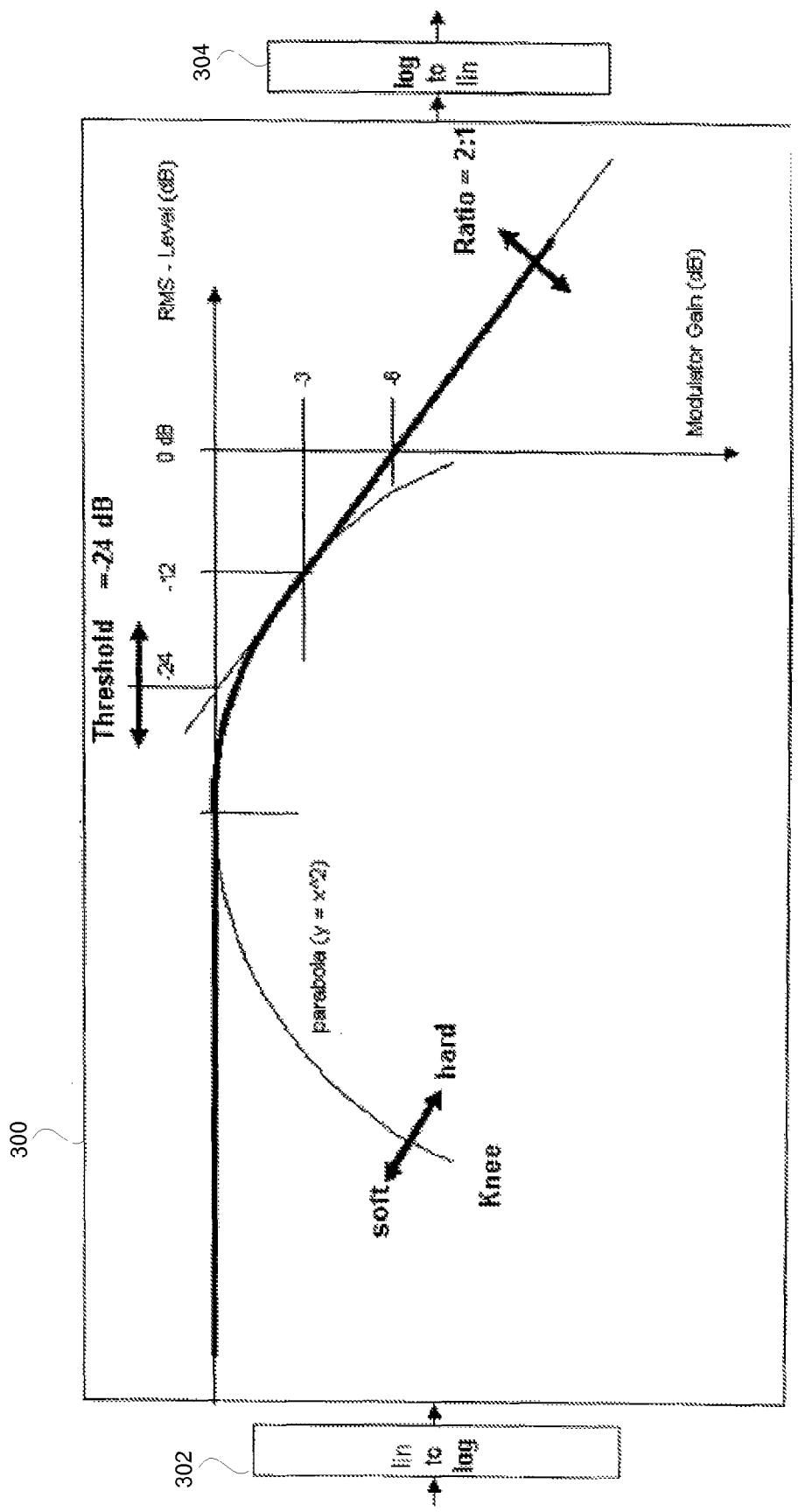
FIG. 3 is an exemplary static characteristic curve of an audio compressor.

FIG. 3 is an exemplary static characteristic curve of an audio compressor. The audio compressor 100 may comprise an attenuator, which regulates its attenuation as a function of the level of the input signal level. The level dependence may be illustrated by a static characteristic curve and the dynamic behavior of the compressor may be described by the time dependence. Chart 300 illustrates a static characteristic curve 301 as a function of a parameter threshold, the ratio, and a knee value. The converter 302 may convert from a linear domain to a logarithmic domain and the converter 304 may convert from the logarithmic domain to a linear domain. The chart 300 illustrates the RMS level in decibels (dB) versus the modulator gain in dB when the audio compressor has a 2:1 ratio and a threshold of almost −24 dB. The curve 301 may have a parabolic shape that approaches a high value and falls back down. The knee value may influence the angle that the curve approaches the high value.

The knee value comprises a different application of compression. The knee value may be classified as either a hard knee or a soft knee. A hard knee may apply a compression after a threshold is reached. A soft knee may apply compression gradually as the threshold is approached. Some audio compressors may include a knee controller that may combine a hard and a soft attribute. The hard knee may occur when the attenuation of the compressor begins with the ratio at the threshold and the signal is just outside the threshold, but is transmitted with a ratio of about 1:1. In some systems, the sound may be more pleasant if the transition from the about 1:1 ratio to the set ratio in a certain domain about the threshold occurs slowly with a soft knee. The characteristic curve transitions softly from the lower left into the upper section with a soft knee.

The knee parameter changes the character of the compression but not its intensity. In chart 300, the curve 301 with a hard knee is more rounded, while the curve with a softer knee is more gradual as it approaches the threshold. It may be necessary to determine whether the curve 301 has exceeded the threshold. The proximity of the curve 301 to the threshold may be determined in soft knee compression. In one system, a peak level may be determined as the RMS level. The RMS level may correspond to the perceived volume.

The relationship between the input level and the output level may be represented by a static characteristic curve, such as the curve 301. A static characteristic curve applies under static conditions, such as when the volume of the input signal does not change or changes slowly. The dynamic behavior of an audio compressor may be determined by adjustable parameters, such as the attack and the release. The attack time may be a measurement of the reaction time of an audio compressor. A fast rise in signal level may result in an attack time, which is the time to regulate (compress) the signal level. The attack time may comprise an adjustable time interval that elapses with a rise in the signal level after the threshold is exceeded and before the effect of the compressor is initiated. Once the threshold is reached, the attack time is a measurement of the time it takes the compressor to attenuate the signal. A fast drop in signal level may result in a release time, which is the time to stop regulation of the signal. The release time may be an adjustable time interval that elapses after the signal level is dropped below the threshold and before the attenuation (compression) is stopped. The release time is the time it takes the compressor to stop its attenuation after the signal level drops below the threshold.

The timing component 108 may include one or more filters. In one system, the timing component 108 may include a filter that includes both release functionality (e.g. a release filter 110) and attack functionality (e.g. an attack filter 112). The timing component 108 applies an adjustable time response. The output of the timing component 108 may be applied to the input signal, which is compressed. Compression may occur through a multiplication of the output of the timing component 108.

Figure 4:
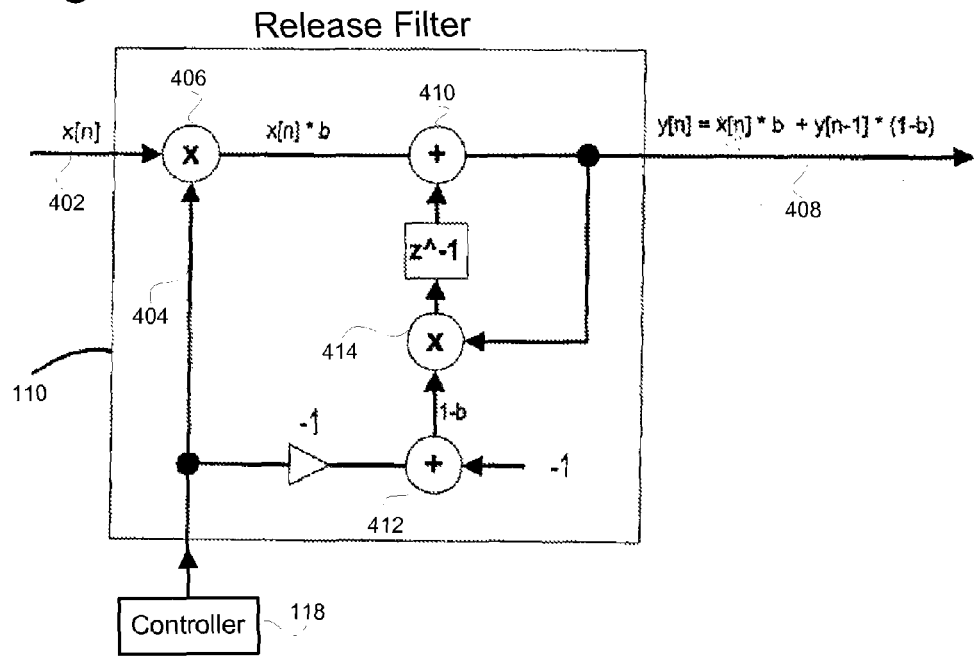
FIG. 4 is a release filter that may be part of an audio compressor.

FIG. 4 is a release filter that may be part of an audio compressor. The release filter 110 comprises an exemplary timing component 108 within the audio compressor. The release filter may comprise many different circuits or configurations. The release filter 110 may comprise a digital low-pass filter of the first order with a filter coefficient "b."

The release filter 110 may receive a signal 402 from the gain generator 106, which may be a gain function represented as "x[n]," where n comprises the sample number in the signal. The release filter 110 may receive a feedback signal from the controller 118. The feedback signal is based on the compressed output signal 114 that is fed back to the release filter 110. The value b may be the output signal 404 that is received from the controller 118. The "x[n]" input 402 may be multiplied by the b value 404 at the multiplier 406 to generate a signal of "x[n]*b." The "x[n]*b" signal is input into the adder 410, which produces the "y[n]" output signal 408. The "y[n]" output signal 408 is multiplied at the multiplier 414 by the value "1−b" resulting from the adder 412. The output from the multiplier 414 is "(1−b)*y[n−1]." The output from the adder 408 may be represented by the equation: y[n]=x[n]*b+y[n−1]*(1−b). The "y[n]" output value 416 may be transmitted to the attack filter 112 or another timing component 108.

As described, the coefficient value "b" may be calculated adaptively from the output signal of the compressor. The parameter for these calculations may be a set release time value and/or a parameter "PF," which may be a freezing parameter or freezer value. The freezing parameter may be used to reduce or inhibit pumping. Alternatively, the freezing parameter may not be used when pumping effects are not disturbing. The pumping effect may be controlled or adjusted by controlling the release behavior with the parameter "PF." In one system, the release time may be changed as a function of the parametric setting of the compressor output signal. Accordingly, pumping effects may be controlled. The control may classify the audio signal between a "static" and a "dynamic" at the output of the compressor. When static signals are detected, the control may slow the compressor down or to "freeze" its temporal response.

Figure 5:
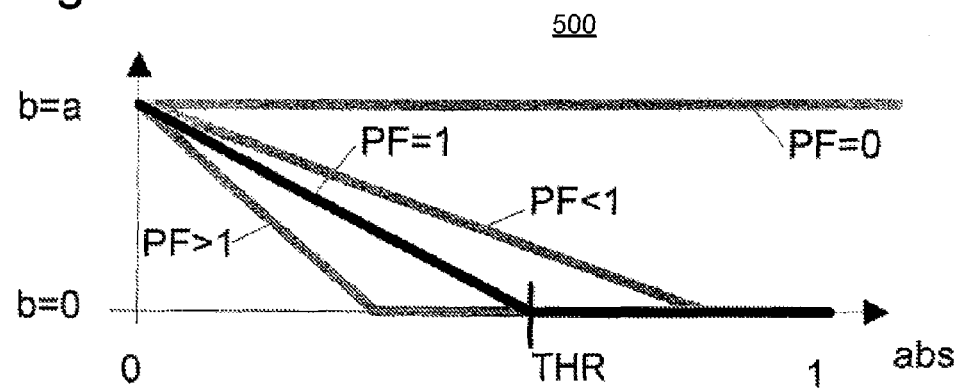
FIG. 5 shows a relationship between a filter coefficient and an absolute value of the output.

FIG. 5 is shows a relationship between a filter coefficient and an absolute value of the output. The chart 500 may illustrate the dependence of the filter coefficient of the release filter 110 as a function of the absolute value of the compressed output signal 114 and of the additional parameter "PF." The value a represents a static filter coefficient, which may be adjusted by the user. The value "b" represents an adapted filter coefficient. The value "abs" comprises the absolute value of the compressor output signal 114. The threshold value "THR" represents a threshold value that is recalculated in the linear domain. The threshold value "THR" is compared with the input signal to determine when the audio compressor should attenuate the signal.

When the freezer parameter "PF" is set to zero (e.g. PF=0) or about zero, the preset release time may be a constant. The adapted filter coefficient may equal the static filter coefficient (e.g. b=a) regardless of the absolute value (abs) of the compressor output signal 114. When the parameter PF is raised, the dependence on the absolute value (abs) of the compressor output signal 114 may increase. The release time may be increased and the release behavior may slow down in proportion to the closeness of the output level with the threshold. A limit may be achieved when the coefficient "b" reaches the value zero, which may correspond to a full freezing and/or the approaching of an infinite release time. The effect of an increasing release time may occur when the compressor output signal 114 increases.

With an appropriate parameterization, such as "PF<1," the release time may further increase in the region above the threshold "THR" and approach infinity at levels higher than the threshold "THR." The parameter "PF" may comprise a weighting parameter applied to the compressor output signal 114. The release time may be modified based on the weighted output signal. Signal levels from the compressor output signal 114 that lie below the threshold "THR" may produce faster release behavior. Signal levels near the threshold "THR" and/or above the threshold "THR" may produce a slower release behavior. For certain applications, negative values of "PF" may also be meaningful. The behavior of the controller 118 may then be reversed because for signals near the threshold, the release time would be shortened.

Figure 6:
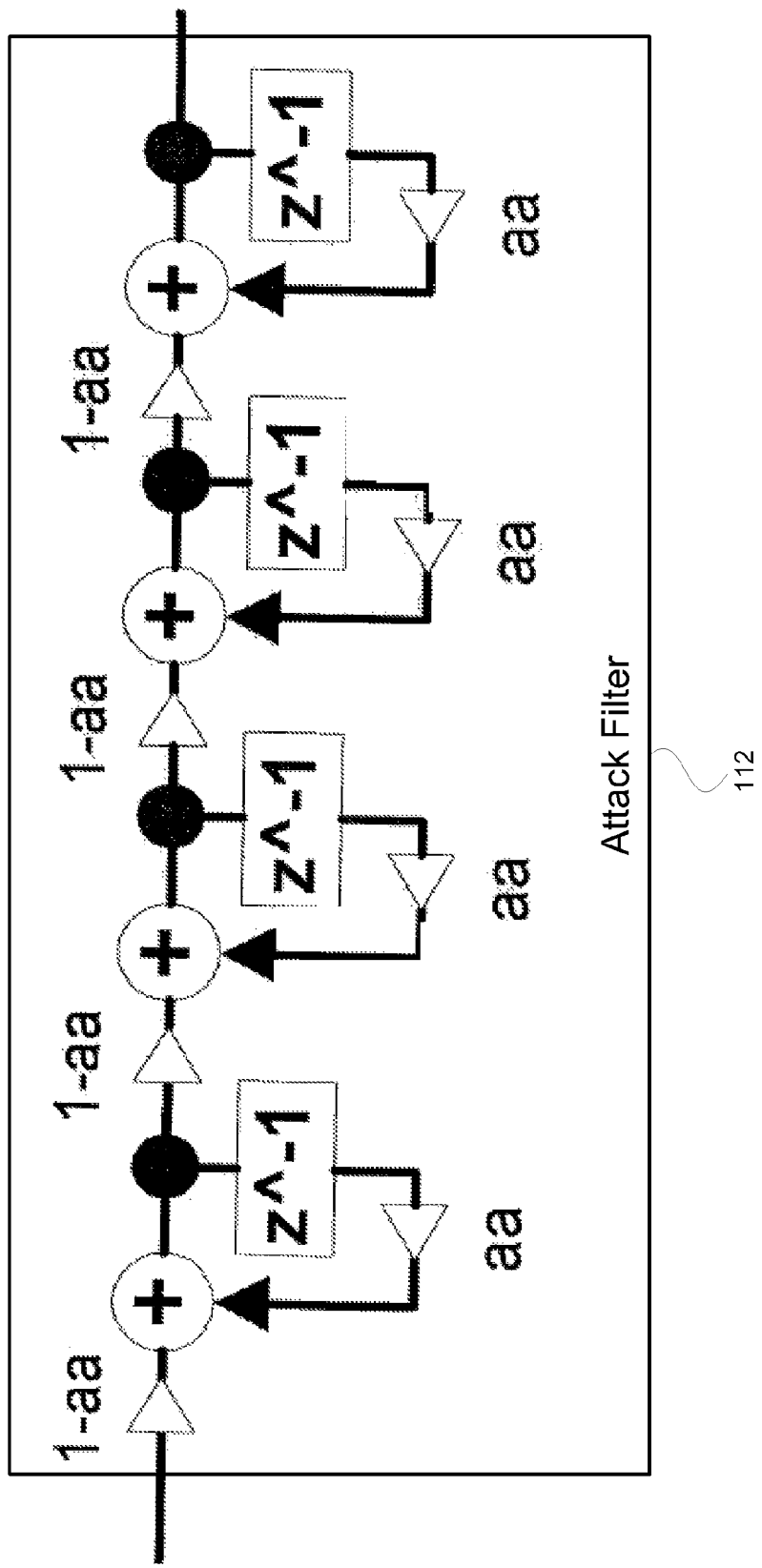
FIG. 6 is an attack filter that may be part of an audio compressor.

FIG. 6 is an attack filter 112 that may be part of the audio compressor 100. The attack filter 112 may comprise a low-pass filter of the $4^{th}$ order with adjustable time constants ranging from approximately 1 ms to approximately 500 ms. The attack time may be a measurement of the reaction time of an audio compressor. A fast rise in signal level may result in an attack time. An attack time may comprise the time it takes for the compressor to begin regulating the signal level. The attack filter may be active when the modulation function has falling values, such as a negative first derivative. The level at the compressor input may rise above the threshold THR in the attack phase. However, the release filter 110 may act if the level at the input of the compressor drops below the threshold.

Figure 7:
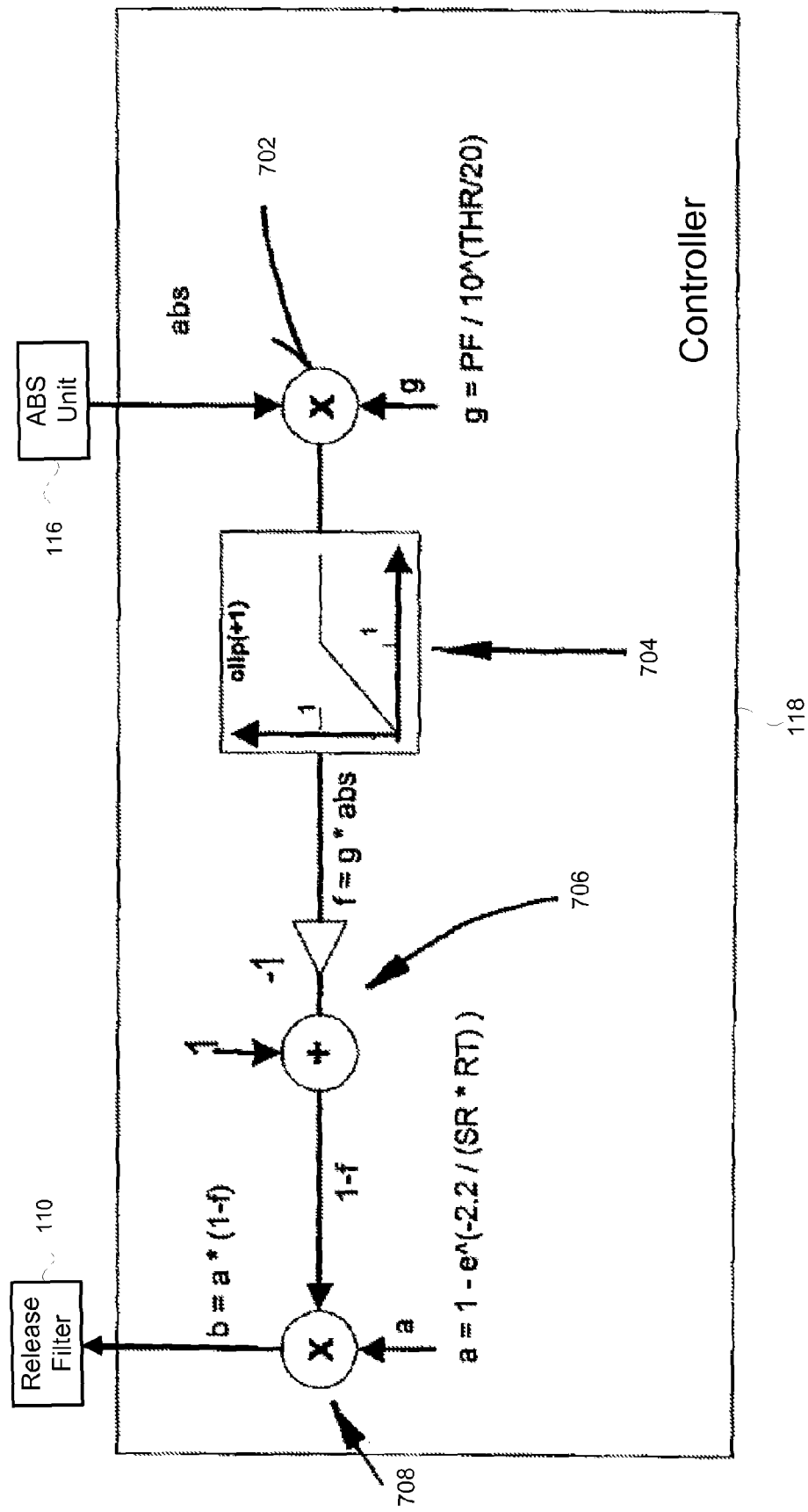
FIG. 7 is a diagram of a controller in an audio compressor.

FIG. 7 is a controller 118 that may be part of the audio compressor 100. The controller 118 may receive the compressed output signal 114 as part of a feedback loop. In one system, the compressed output signal 114 may pass through an "ABS" unit 116 which transmits the absolute value of the compressed output signal 114 to the controller 118. The outputted feedback signal from the controller 118 is transmitted to the release filter 110.

In the controller 118, the absolute value "abs" may be multiplied by an operator 702 with the value g, which may be $g=PF/10^{(THR/20)}$. "THR" may represent the threshold in dB. The clipper 704 may limit the input signal to a value of about +1. In one system, values smaller than about 1 may be allowed to pass through unchanged, while any input values greater than about +1 may result in an output value of about +1. The output from the operator 702 after the clipper 704 may be the value "f," where f=g*abs. The value "f" may represent the relation between the absolute value of the compressed output signal 114 and the threshold "THR" multiplied by the parameter "PF."

The arithmetic operator 706 may result in a sum of about +1 and about −f, resulting in "1−f." The multiplication operator 708 may multiply (1−f) by the value "a" to generate the value "b," where b=a*(1−f). The value "b" is transmitted to the release filter 110. In one example, the value of a may be a=1−exp(−2.2/(SR*RT)), where SR is the sampling rate in hertz (Hz) and "RT" is a release time constant. The feedback signal that is transmitted to the release filter 110 from the controller 118 may be: b=(1−exp(−2.2/(SR*RT)))*(abs*(1−(PF/10$^{(THR/20)}$))).

The controller 118 may be operative to control a pumping phenomenon through the feedback signal that is transmitted to the release filter 110. The controller 118 may allow a user to adjust the coefficients that determine the signal that is transmitted to the release filter 110. The parameter "PF" may be adjustable and adjustments to the parameter "PF" may be used to increase or decrease pumping by the audio compressor 100. The formulation of the filter coefficients may be described with respect to FIGS. 8 and 9.

Figure 8:
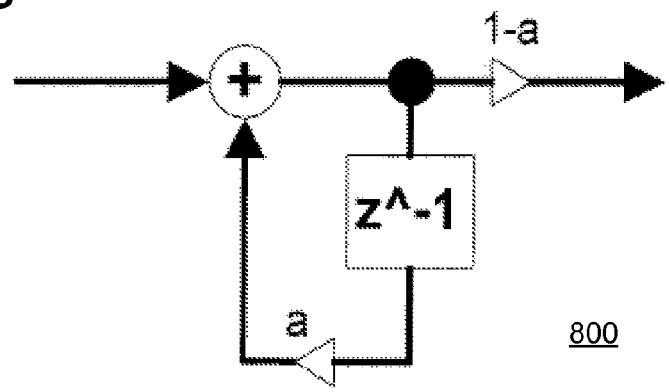
FIG. 8 is a step response of a release filter.
Figure 9:
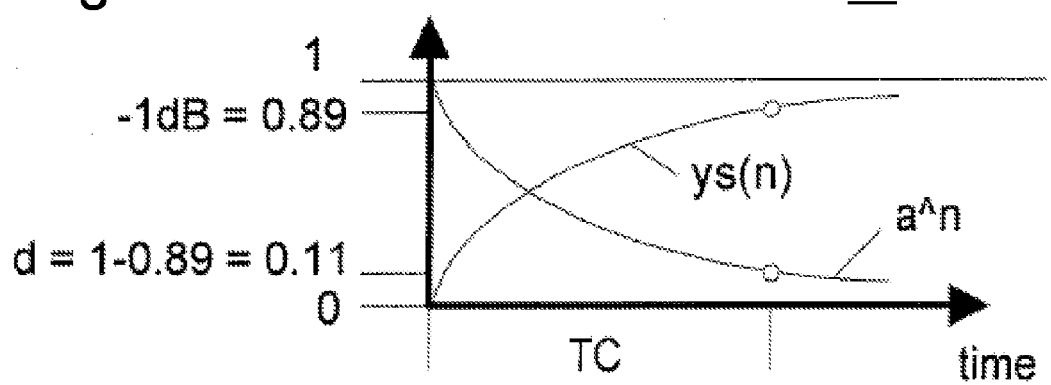
FIG. 9 shows a filter coefficient as a function of a time constant.

FIG. 8 is a diagram of a step response 800 of the release filter 110. The step response 800 may produce an exponential function. The exponential function may be illustrated in FIG. 9. In particular, chart 900 illustrates a filter coefficient as a function of a time constant. The chart 900 illustrates "ys(n)" where ys(n)=1−a″. "ys(n)" may be the step response of the filter where n=TC*SR with "TC" as the time constant in seconds [s] and "SR" is the sampling rate in hertz [Hz].

The calculated adjustable parameter may be the filter coefficient a, which produces an exponential function, and reaches the value "d" after the time "TC." A transformation of d=a″ produces a=exp(ln(d)/(TC*SR)). The value "d" may be selected so that the step function has shifted to about −1 dB after the time "TC," such that ln(d)=ln(0.11)=−2.2. The static filter coefficient may them be selected as a=1−exp(−2.2/SR*TC)), with the sample rate "SR" in Hertz and the time constant "TC" in seconds. For the release filter 110, the time constant "TC" may be selected to equal the release time constant "RT." When the parameter "PF" is equal to about zero (PF=0, f=0), the static filter coefficient may be taken as unchanged by the release filter 110, such that b=a. The preset release time RT may determine the dynamic behavior of the audio compressor 100 when the signal falls below the threshold.

When the value of PF=1, the ratio between the absolute value "abs" of the compressor output signal 114 and the threshold value "THR" (where THR may signify the threshold recalculated for the linear domain) may determine the value of the release filter coefficient "b," which may also be referred to as the adapted filter coefficient. If the ratio is 1, such that the value abs reaches the threshold "THR," the value b=0 may be obtained. The value b=0 may correspond to an infinitely long release time and the gain value of a characteristic curve of the generator 106 may be frozen until the compressed output signal 114 falls below the threshold.

For "PF" values greater than or smaller than 1, the adapted filter coefficient b may depend on the absolute value "abs" at the compressor output. Different processes may be inserted depending on the desired dynamic characteristics within the region near the threshold of the output signal. For example, the freezing for "PF" may take place for signals above the threshold, while for PF>1, freezing may have already occurred before the thresholds was reached. Based on the dynamics of the compressor, the increasing approximation of the absolute value "abs" of the output signal compared with the threshold may result in the release time being increased.

An adjustment of the release time value or other coefficients may be used to control the dynamics of the audio compressor, such as the pumping phenomenon. An adjustment of the static release time "RT," which is the release time when PF=0, may be caused by setting the freezer parameter "PF." The dynamics of the compressor may be configured based on the adjustments. The parameter "PF" may be selected so that the value of "b" is in close proximity to the threshold "THR" to reduce the pumping effect. Conversely, the parameter "PF" may be selected to be close to zero, which may produce the desired application of pumping.

The threshold of the gain generator 106 and the threshold with which the compressed output signal 114 may compared or rationed may have different magnitudes. Other filter structures may be used for the release filter 110 and the attack filter 112, such as filters of a higher order. Other filter parameters may be utilized by the compressor than those described. Any set of parameters which in effect produce a change of the effective release time as a function of the output signal and a user adjustable parameter may be used.

Figure 10:
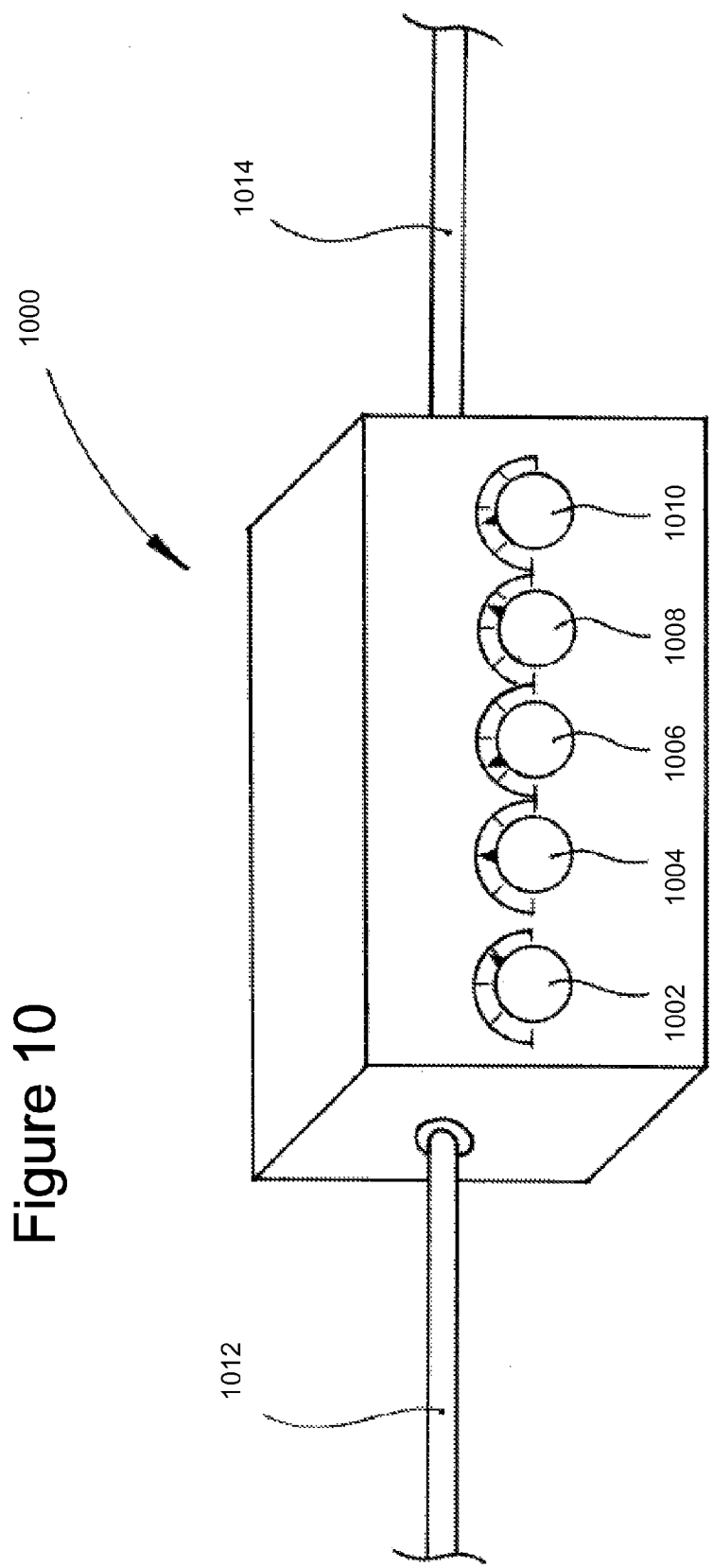
FIG. 10 is an exemplary compressor.

FIG. 10 is an exemplary compressor 1000. The compressor 1000 may be integrated in a variety of audio devices, such as microphones, mixers, recording and play-back devices, loudspeakers, or as shown in FIG. 10, the compressor 1000 may be designed as an independent or remote device with a user interface. The user interface may include an input device, such as a touchscreen, buttons, a keyboard or other dials, which may be used to set the parameters of the compressor 1000. In one system, the user interface may be operative to allow adjustments of the threshold, ratio, release time, attack time, knee, and/or the freezer parameter "PF." For example, the adjustable release time value may correspond with the actually operative or effective release time when PF=0 or when there is no dependence on the output signal.

The compressor 1000 may receive an audio input line 1012 and transmit an audio output line 1014. In one system, the audio input line 1012 may be the input signal 102 and the audio output line 1014 may be the compressed output signal 114. The compressor 1000 may adjust the signal level of the audio input line 1012. The user interface of the compressor 1000 may include rotary knobs positioned in front of a panel that adjusts the parameters of the compressor 1000. For example, knobs 1002, 1004, 1006, and 1008 may permit the adjustment of the parameters threshold, ratio, static release time and attack time, respectively.

The additional knob 1010 may adjust the parameter "PF." An adjustment of the parameter "PF" may modify the effective release time dependent on the compressor output signal. The release time may be static when the feedback loop is abrogated and/or the parameter "PF" is set equal to or almost equal to zero. In other instances, the value of the release time may be dynamic and may change depending on the output signal. In other systems, the user interface of the compressor 1000 may be different to allow for an activation of the feedback loop connecting release filter 110 with the compressor output line 1014 and to adjust the influence of output signal on the release time change.

The mathematical operators, the filter designs, and the compressor components may have many different configurations. The compressor may be implemented as a software algorithm with a digital signal processor. The compressor may be a feed forward structure, e.g. the calculation of the control function gain (amplitude modulation) derives from the input signal. The audio signals may be transformed to or be available in the digital form.

The methods discussed above may be encoded in a signal bearing medium, a computer readable medium such as a memory, programmed within a device such as one or more integrated circuits, one or more processors or processed by a controller or a computer. If the methods are performed by software, the software may reside in a memory resident to or interfaced to a storage device, synchronizer, a communication interface, or non-volatile or volatile memory in communication with a transmitter. A circuit or electronic device designed to send data to another location. The memory may include an ordered listing of executable instructions for implementing logical functions. A logical function or any system element described may be implemented through optic circuitry, digital circuitry, through source code, through analog circuitry, through an analog source such as an analog electrical, audio, or video signal or a combination. The software may be embodied in any computer-readable or signal-bearing medium, for use by, or in connection with an instruction executable system, apparatus, or device. Such a system may include a computer-based system, a processor-containing system, or another system that may selectively fetch instructions from an instruction executable system, apparatus, or device that may also execute instructions.

A "computer-readable medium," "machine readable medium," "propagated-signal" medium, and/or "signal-bearing medium" may comprise any device that contains, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

I claim:

1. An audio compressor for modifying a dynamic range of an audio signal comprising:
   a detector that receives the audio signal and determines a value indicative of a perceived volume of the audio signal;
   a gain generator in communication with the detector and configured to generate a gain function that attenuates the audio signal when the signal is above a threshold value in accordance with a static characteristic curve;
   a release filter configured to receive the gain function from the gain generator, where the release filter uses an adjustable parameter to bring about a release time that elapses from a drop in the audio signal below the threshold value and before the attenuation is stopped, the release filter further configured to generate an adjusted gain function to apply to the input signal to either attenuate or amplify the input signal to generate a compressed output signal; and
   a controller in communication with release filter to provide the adjustable parameter to the release filter, the controller configured to receive the compressed output signal and to dynamically determine the adjustable parameter based on the compressed output signal, a static release time, and the threshold, where the release filter uses the adjustable parameter to dynamically adjust the release time.

2. The audio compressor according to claim 1 where the adjustable parameter for adjusting the release time of the release filter includes at least one release filter coefficient.

3. The audio compressor according to claim 1 where the adjustable parameter is modified to vary the release time depending on a ratio between the weighted signal output and the threshold value.

4. The audio compressor according to claim 1 where the determined value by the detector comprises a root mean square (RMS) value calculated from the audio signal.

5. The audio compressor according to claim 1 where the attenuation of the audio signal is a compression of the audio signal above the threshold.

6. The audio compressor according to claim 1 further comprising an attack filter in communication with the release filter and the gain generator that includes an attack time, where the attack time is a time after the audio signal surpasses the threshold value and before the attenuation is started.

7. The audio compressor according to claim 1 further comprising an absolute value unit in communication with the controller that provides an absolute value of the output of the audio compressor to the controller as a part of the feedback signal.

8. The audio compressor according to claim 1 where the adjustment of the release time of the release filter can adjust a pumping effect from the audio signal.

9. A system for dynamic compression of an input signal comprising:
   a detector configured to determine a measures of perceived volume for the input signal;
   a gain generator in communication with the detector, the gain generator configured to generate a gain function configured to adjust the measure of perceived volume based on a comparison with a threshold value;
   a timing component in communication with the gain generator, the timing component configured to receive the gain function and to adjust the gain function according to an adjustable time response where the adjusted gain function is applied to the input signal to either attenuate or amplify the input signal to generate a gain-adjusted output signal; and
   a controller in communication with the timing component, the controller configured to receive the output signal, and to determine an adjustable parameter to provide to the timing component based on the output signal, where the timing component uses the adjustable parameter to bring about the adjustable time response.

10. The system according to claim 9 where the timing component comprises a release filter characterized by release filter coefficients configured to operate as the adjustable parameter determined by the controller to bring about the adjustable time response.

11. The system according to claim 10 where the release filter coefficients are determined to bring about the adjustable time response as a release time that elapses from a change in input signal relative to the threshold until adjustment of the signal level is stopped.

12. The system according to claim 9 where the adjustable parameter is modified to vary the adjustable time response in depending on a ratio between the weighted signal output and the threshold value.

13. The system according to claim 9 where the detector computes a root mean square (RMS) value of the input signal as the measure of perceived volume.

14. The system according to claim 9 where the timing component comprises an attack filter.

15. The system according to claim 14 where the attack filter establishes an attack time that that elapses from a change in input signal relative to the threshold until adjustment of the signal level is initiated.

16. A method for adjustable audio compression comprising:
   receiving an input audio signal;
   determining a gain function to apply to the input audio signal to modify a dynamic range of the input audio signal relative to a threshold;

generating an adjustable parameter for applying an adjustable time response for applying the gain function to the input signal;

generating an adjusted gain function based on the adjustable time response; and providing an output audio signal by applying the adjusted gain function to the input signal;

where the step of generating the adjustable parameter includes determining the adjustable parameter based on the output audio signal received as feedback and the threshold.

17. The method according to claim 16 where the adjustable parameter is based on at least one user-adjustable parameter in addition to the output audio signal and the threshold.

18. The method according to claim 17 where the step of generating the adjusted gain function includes filtering the gain function using a release filter where the adjustable parameter includes a release filter coefficient and where an adjustment of the release filter coefficient modifies an effective release time for adjusting the gain function.

19. The method according to claim 18 where the modification of the effective release time can adjust a pumping effect from the input audio signal.

20. The method according to claim 18 where the step of generating the adjustable parameter includes determining the release filter coefficient as a function of:
- a freezing parameter having a value that controls the extent to which the effective release time is modified as a function of the difference between the compressed output signal and the threshold;
- a static release time used as the release time regardless of the value of the compressed output signal;
- a static attack time uses as an attack time regardless of the value of the compressed output signal; and
- a compression ratio between an input dynamic range and an output dynamic range.

21. The method according to claim 17 where the at least one user-adjustable parameter includes either a compression ratio, a static release time, a static attack time, a freezing parameter, or a combination thereof.

* * * * *